(12) United States Patent
Miida

(10) Patent No.: US 6,747,264 B2
(45) Date of Patent: Jun. 8, 2004

(54) CHANGEABLE GAIN AMPLIFIER, SOLID-STATE IMAGING DEVICE AND OPTICAL SIGNAL READING METHOD

(75) Inventor: Takashi Miida, Kanagawa (JP)

(73) Assignee: Innotech Corporation (JP)

( * ) Notice: Subject to any disclaimer, the term of this patent is extended or adjusted under 35 U.S.C. 154(b) by 0 days.

(21) Appl. No.: 10/074,227

(22) Filed: Feb. 14, 2002

(65) Prior Publication Data

US 2002/0134918 A1 Sep. 26, 2002

(30) Foreign Application Priority Data

Feb. 19, 2001 (JP) ........................................ 2001-041394
Feb. 12, 2002 (JP) ........................................ 2002-034496

(51) Int. Cl.[7] ............................................. H01J 40/14
(52) U.S. Cl. ............................ 250/214 AG; 330/308; 348/300
(58) Field of Search .................. 250/214 A, 208.1, 250/214 AG; 348/300–302, 308, 241; 330/308; 257/72

(56) References Cited

U.S. PATENT DOCUMENTS

| | | | |
|---|---|---|---|
| 4,438,354 A | * 3/1984 | Haque et al. | 327/337 |
| 4,555,668 A | * 11/1985 | Gregorian et al. | 330/9 |
| 5,355,013 A | 10/1994 | Parker | 257/458 |
| 5,717,458 A | * 2/1998 | Yonemoto | 348/305 |
| 5,892,540 A | * 4/1999 | Kozlowski et al. | 348/300 |
| 6,051,857 A | 4/2000 | Miida | 257/292 |
| 6,128,039 A | 10/2000 | Chen et al. | 348/294 |
| 6,218,656 B1 | 4/2001 | Guidash | 250/208 |
| 6,342,694 B1 | * 1/2002 | Satoh | 250/214 A |
| 6,529,237 B1 | * 3/2003 | Tsay et al. | 348/241 |

* cited by examiner

Primary Examiner—Thanh X. Luu
Assistant Examiner—Stephen Yam
(74) Attorney, Agent, or Firm—Lorusso, Loud & Kelly

(57) ABSTRACT

A solid-state imaging device is provided, which is capable of increasing an S/N ratio while enhancing a dynamic range, when a photoelectric signal is converted into a digital signal. This solid-state imaging device comprises: a plurality of photoelectric conversion devices arrayed in rows and columns, each of the photoelectric conversion devices converting an optical signal into an electric signal and outputting a first signal voltage; a difference signal generation circuit provided for each column, for sequentially inputting the first signal voltage and a second signal voltage obtained by initializing the photoelectric conversion devices, thereafter converting the first signal voltage and the second signal voltage into charges, generating a difference signal therebetween, and then outputting the difference signal after adjusting a gain according to a level of the difference signal; and an analog/digital conversion circuit connected to the output of the difference signal generation circuit.

2 Claims, 10 Drawing Sheets

CHANGEABLE GAIN AMPLIFIER, SOLID-STATE IMAGING DEVICE AND OPTICAL SIGNAL READING METHOD

BACKGROUND OF THE INVENTION

1. Field of the Invention

The present invention relates to a variable gain amplifier capable of adjusting a gain according to a level of an input signal, to a solid-state imaging device for converting an optical signal into a digital signal and outputting the digital signal, which is used for a video camera, an electronic camera, an image input camera, a scanner, a facsimile or the like, and to an optical signal reading method.

2. Description of the Related Art

A semiconductor image sensors such as a CCD image sensor and a MOS image sensor are excellent in mass production, and thus such sensors have been applied to many image input devices along with an advance in a fine patterning technology.

Especially, in recent years, a CMOS image sensor has been a main focus of attention because of its advantages in contrast with the CCD image sensor, i.e., smaller power consumption, and capability of fabricating a sensor device and a peripheral circuit device by the same CMOS technology.

Such a CMOS image sensor is described in U.S. Pat. No. 6,128,039. The CMOS image sensor disclosed in U.S. Pat. No. 6,128,039 is called an active pixel sensor. As shown in FIG. 1 transferred from this US patent, in combination with an active load such as a constant current source M4 or the like, a signal voltage is outputted by a source follower.

In the CMOS image sensor of U.S. Pat. No. 6,128,039, a load capacitor C1 for storing signal charges and a gate-source capacitor Cgs of the reading transistor M2 are connected in series to a gate of M2. These capacitors are set parallel in a fixed capacitor for charge/voltage conversion, and the fixed capacitor for charge/voltage conversion is seemingly changed in the capacitance. Charging of the capacitor C1 connected to the source of M2 greatly changes a source potential during signal reading. As this potential change is returned through the capacitor Cgs to the gate, an input potential is also changed, causing a considerable deterioration of linearity of a transmission characteristic. Consequently, in this CMOS image sensor, the constant current source M4 as a load of a reading transistor M2 was inevitable.

In addition, in recent years, a column type analog/digital converter of an integration system (hereinafter referred to as a column type ADC) has been mounted on the image sensor. In such a column type ADC, an analog electric signal (photoelectric signal) into which an optical signal is converted is compared with a comparison lamp voltage having a predetermined gradient by a comparator, and is converted into a pulse count corresponding to an amplitude of the photoelectric signal by a pulse counter.

In such a case, when the analog signal is small, a gradient of the comparison lamp voltage is also reduced to secure a dynamic range.

Furthermore, in a solid-state imaging device including a number of unit pixels arrayed in horizontal and vertical directions, sampling pixels are thinned to output only detecting signals of remaining pixels not thinned during moving image reproduction, thereby increasing a frame rate.

However, in the case of the image sensor including the constant current source M4 for each column, since there are variances in characteristics among the respective constant current sources M4, variances are generated in gains among columns. This variance appears as an offset difference between columns, and when seen on a screen, the variance appears as a so-called vertical fixed pattern noise.

When a signal voltage outputted from the conventional image sensor is inputted to the column type ADC, a gradient of a comparison lamp voltage is reduced corresponding to a small analog signal. In this case, a limitation is placed on an S/N ratio because of linearity of a lamp signal or comparison accuracy of the comparator, and because of an influence of an offset voltage generated in a photoelectric conversion device or the like.

Furthermore, if sampling pixels are thinned in the conventional image sensor, a modulation transfer function (MTF: resolution) is deteriorated, forming an image of much moire. In addition, when a reduction is made twice or lower as large as a sampling frequency proportional to an inverse number of a sampling pixel interval because of the thinning of the sampling pixels, a folding noise (aliasing noise) may be thus generated. Also, as it is necessary to operate the image sensor at a high speed according to the number of pixels, power consumption is increased.

SUMMARY OF THE INVENTION

This present invention is performed considering the foregoing drawbacks.

An object of the present invention is to provide a variable gain amplifier, a solid-state imaging device, and an optical signal reading method being capable of improving an S/N ratio while enhancing a dynamic range when a photoelectric signal is digitized.

Another object thereof is to provide a solid-state imaging device and an optical signal reading method being capable of reducing fixed pattern noises and further suppressing a reduction in resolution and generation of folding noises while maintaining a low power consumption operation by thinning sampling pixels.

A variable gain amplifier of the present invention is characterized in that it converts a first signal voltage and a second signal voltage into charges by sequentially inputting the first and second signal voltages, generates a difference signal between the first and second signal voltages, amplifies the difference signal by a gain so as to set the difference signal within a requested range of a digital encoding analog input level, and outputs the difference signal.

A variable gain amplifier comprises a so-called chopper type switched capacitor integrating circuit. The chopper type switched capacitor integrating circuit includes, as shown in FIG. 2 as the example,: an operational amplifier 31 having a positive input terminal (+) to which a reference voltage Vref is applied and a negative input terminal (−), and an output terminal; an input capacitor Ci (C1) provided in a signal path extending from the input terminal of the variable gain amplifier 105a to the negative input terminal (−) of the operational amplifier 31; a feedback capacitor Cf composed of a plurality of capacitors (C2, C3, C4, . . . etc.) provided between the negative input terminal (−) and output terminal of the operational amplifier 31; first switch devices SW1 and SW2 for connecting/disconnecting a signal path extending from the input terminal of the variable gain amplifier 105a to the other end of the input capacitor Ci; a second switch device SW3 for turning ON/OFF (connecting/disconnecting) an input of the reference voltage Vref to the other end of the input capacitor Ci; and a third switch device SW4 for connecting/ disconnecting a signal path between the negative input terminal (−) and output terminal of the operational amplifier 31.

An amplifying gain of the operational amplifier 31 can be adjusted as follows.

That is, the capacitors C2, C3, C4 . . . etc. constituting the feedback capacitor Cf are connected to switch devices (SW5, SW6 . . . etc.) for controlling connection/disconnection of the respective capacitors between the input and output terminals of the operational amplifier 31. Accordingly, by selectively connecting/disconnecting the switch devices (SW5, SW6 . . . etc.), a proper capacitor is selected and connected between the input and output terminals of the operational amplifier 31. Therefore, by increasing/reducing a capacitance of the feedback capacitor Cf, a ratio (Ci/Cf) of the input capacitor Ci with respect to the feedback capacitor Cf is adjusted. With this, it is possible to adjust the gain of the operational amplifier 31.

A solid-state imaging device comprises photoelectric conversion devices arrayed in rows and columns, the foregoing variable gain amplifier provided for each of the columns and connected to outputs of the photoelectric conversion devices of each column, and an analog/digital conversion circuit for converting a difference signal into a digital signal, which is connected to an output side of the variable gain amplifier. In this case, a first signal voltage to be inputted to the variable gain amplifier is obtained by converting an optical signal into an electric signal, and a second signal voltage is obtained when the photoelectric conversion device is initialized.

The optical signal reading method is characterized in the followings. That is, the first signal voltage is converted into charges and then charges are stored, followed by outputting the second signal voltage and then converting it into charges. And the difference signal between the first signal voltage stored as charges and the second signal voltage converted into charges is amplified with the gain such that the difference signal is within the requested range of the digital encoding analog input level.

In other words, even when amplitude of the analog difference signal is smaller than the proper range of the digital encoding analog input level, the analog difference signal can be amplified to be properly set within the range of the digital encoding analog input level. As a result, when the analog difference signal is digitized, it is possible to secure the dynamic range and to improve the S/N ratio.

Moreover, the foregoing solid-state imaging device includes the heavily doped buried layer for storing photo-generated charges (holes), which is provided below the channel of the MOS transistor for signal detection so as to surround the source region. And the foregoing solid-state imaging device is characterized by its capability of reading out the optical signal even without connecting any active loads such as a constant current source to the source which is the output end of the pixel 101. In this event, since a gate potential is maintained constant by an external power source, the surface potential is uniquely decided by the photo-generated holes stored in the heavily doped buried layer. As a state of the photo-generated holes stored in the heavily doped buried layer is not influenced by a source potential, no unnecessary feedback operations are applied on the heavily doped buried layer even if the source potential is changed during the signal reading. Therefore, the surface potential can be accurately transmitted to the source even if the load of the source follower is only a capacitor capable of being readily matched to each other for characteristics, not a constant current source in which it is difficult to match to each other for characteristics. With this, it is possible to read out a signal while suppressing a fixed pattern noise.

According to another present invention, the difference signal generation circuit is provided, as shown in FIG. 7 as an example, with a pixel mixing switch device SM which makes connection/disconnection of the amplifiers 105a, 105b of at least two columns, more in detail of the negative input terminals of the operational amplifiers 31 thereof. This structure is adequate to the solid-state imaging device which treats moving image.

Further, the thinning operation can be performed with the above structure by connecting the pixel mixing switch device SM to mix signals from pixels of at least two columns and average them.

Thus, even if thinning is carried out during scanning, since an averaged signal is outputted as a signal in the position of the pixel 101 thinned during scanning, deterioration of MTF can be prevented. Further, since no reduction occurs in a sampling frequency, it is possible to prevent generation of the folding noises and obtain a fine image. Moreover, since the number of times of signal processing is reduced according to the thinning, it is possible to prevent the power consumption from increasing.

DESCRIPTION OF THE PREFERRED EMBODIMENTS

Next, description will be made for embodiments of the present invention with reference to the accompanying drawings.

First Embodiment (i) Constitution of Variable Gain Amplifier

Figure 1:
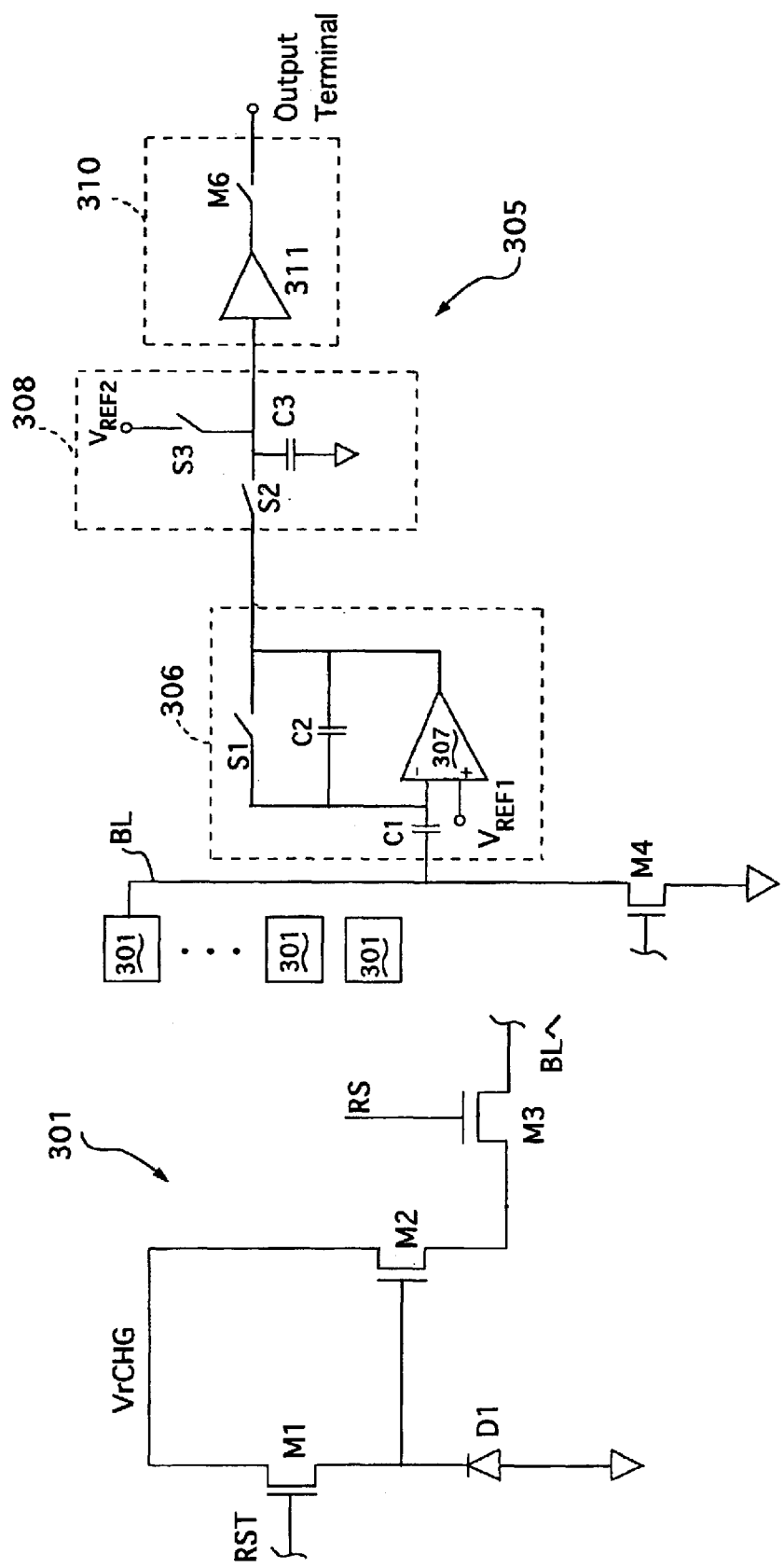
FIG. 1 is a view showing a circuit constitution of a solid-state imaging device of a conventional example.
Figure 2:
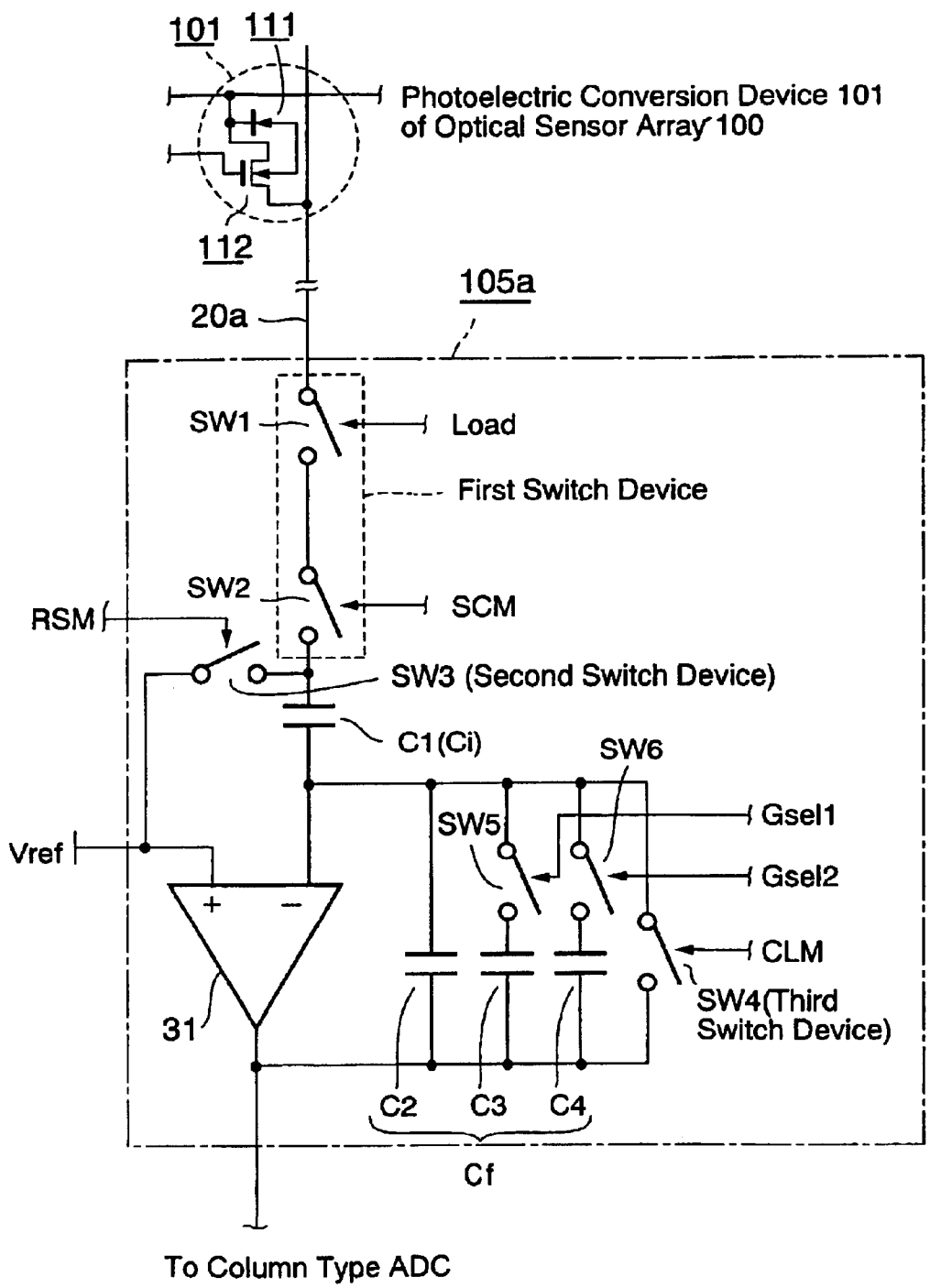
FIG. 2 is a circuit diagram showing a variable gain amplifier according to a first embodiment of the present invention.

By referring to FIG. 2, description is made for a specific constitution of a variable gain amplifier 105a which is a first embodiment of the present invention. This variable gain amplifier 105a is an amplifier circuit capable of generating a difference signal between two signals, and is especially characterized by its capability of changing an amplification factor according to an input level of the difference signal.

As shown in FIG. 2, the variable gain amplifier 105a comprises an operational amplifier 31 which includes a positive input terminal (+), a negative input terminal (−), and an output terminal. A reference voltage (Vref) is inputted to the positive input terminal (+) while, for example, a first signal voltage Vt and a second signal voltage Vn which are outputs of a photoelectric conversion device 101 of an optical sensor array 100 are inputted to the negative input terminal (−). From the output terminal, a difference signal Vs (=Vt−Vn) obtained by subtracting the second signal voltage Vn from the first signal voltage Vt is outputted.

In addition, switch devices SW1 and SW2, and an input capacitor Ci composed of a capacitor C1 are connected in series in a signal path extending from an input terminal of the variable gain amplifier 105a to the negative input terminal of the operational amplifier 31. One end of the input capacitor Ci is connected through the switch devices SW1 and SW2 to the input terminal of the variable gain amplifier 105a, and the other end thereof is connected to the negative input terminal of the operational amplifier 31. The switch devices SW1 and SW2 are defined as a first switch device.

The switch device SW1 is composed of a single n channel MOS transistor, while the switch device W2 is composed of a transmission gate including one or more MOS transistors. Both of the switch devices turn ON/OFF the signal path to input an input signal to one end of the input capacitor Ci. An output end of the photoelectric conversion device 101, for example, is connected to the input terminal of the variable gain amplifier 105a. In case where a large positive voltage is applied through the output end in order to initialize the photoelectric conversion device 101, the switch device SW1 of the first switch device effectively functions to prevent a high voltage from being inputted to the variable gain amplifier 105a.

To one end of the input capacitor Ci, the reference voltage (Vref) is connected via a switch device (second switch device) SW3. Between the negative input terminal (−) and output terminal of the operational amplifier 31, a feedback capacitor Cf and a switch device (third switch device) SW4 are connected parallel to each other.

The feedback capacitor Cf is composed of a plurality of capacitors C2, C3 and C4. In addition, in order to enable adjustment of a capacitance of the feedback capacitor Cf by optionally selecting the capacitors C3 and C4 among those capacitors C2 to C4, fifth and sixth switch devices SW5 and SW6 are provided to connect/disconnect the respective capacitors C3 and C4 between the negative input terminal (−) and the output terminal of the operational amplifier 31.

Note that the feedback capacitor Cf may be composed of three or more capacitors which can be selectively connected/disconnected between the negative input terminal (−) and the output terminal of the operational amplifier 31 in addition to the capacitor C2 whose connection is fixed, and three or more corresponding switch devices SW5, SW6, . . . may be provided to connect/disconnect the respective capacitors C3, C4, . . .

The output terminal of the operational amplifier 31 is connected to an input of a column type ADC 106 for each column. In this event, if a difference signal outputted from the operational amplifier 31 is out of a range of a digital encoding analog input level to the column type ADC 106 of a next stage, an amplifying gain needs to be adjusted to set the difference signal within the range of the analog input level. Accordingly, signals (Gsel1 and Gsel2) are supplied manually or automatically from the outside in order to select at least one of the fifth and sixth switch devices SW5 and SW6 to control ON/OFF thereof. In other words, the adjustment of the amplifying gain of the operational amplifier 31 can be performed by adjusting a ratio (Ci/Cf) of the input capacitor Ci with respect to the feedback capacitor Cf connected between the negative input terminal (−) and the output terminal of the operational amplifier 31. In the embodiment, the feedback capacitor Cf is composed of the plurality of capacitors C2 to C4, and is constituted as capable of optionally selecting a proper capacitor by turning ON/OFF the switch device SW5 or SW6.

Note that although the foregoing switch devices SW1 to SW6 are schematically shown in the drawing, the same function can be achieved in practice by using one or more transistors, similarly to the case of the above-described switch devices SW1 and SW2.

(ii) Constitution of Solid-state Imaging Device

Next, description is made for a solid-state imaging device to which the variable gain amplifier 105a of FIG. 2 is applied.

Figure 3:
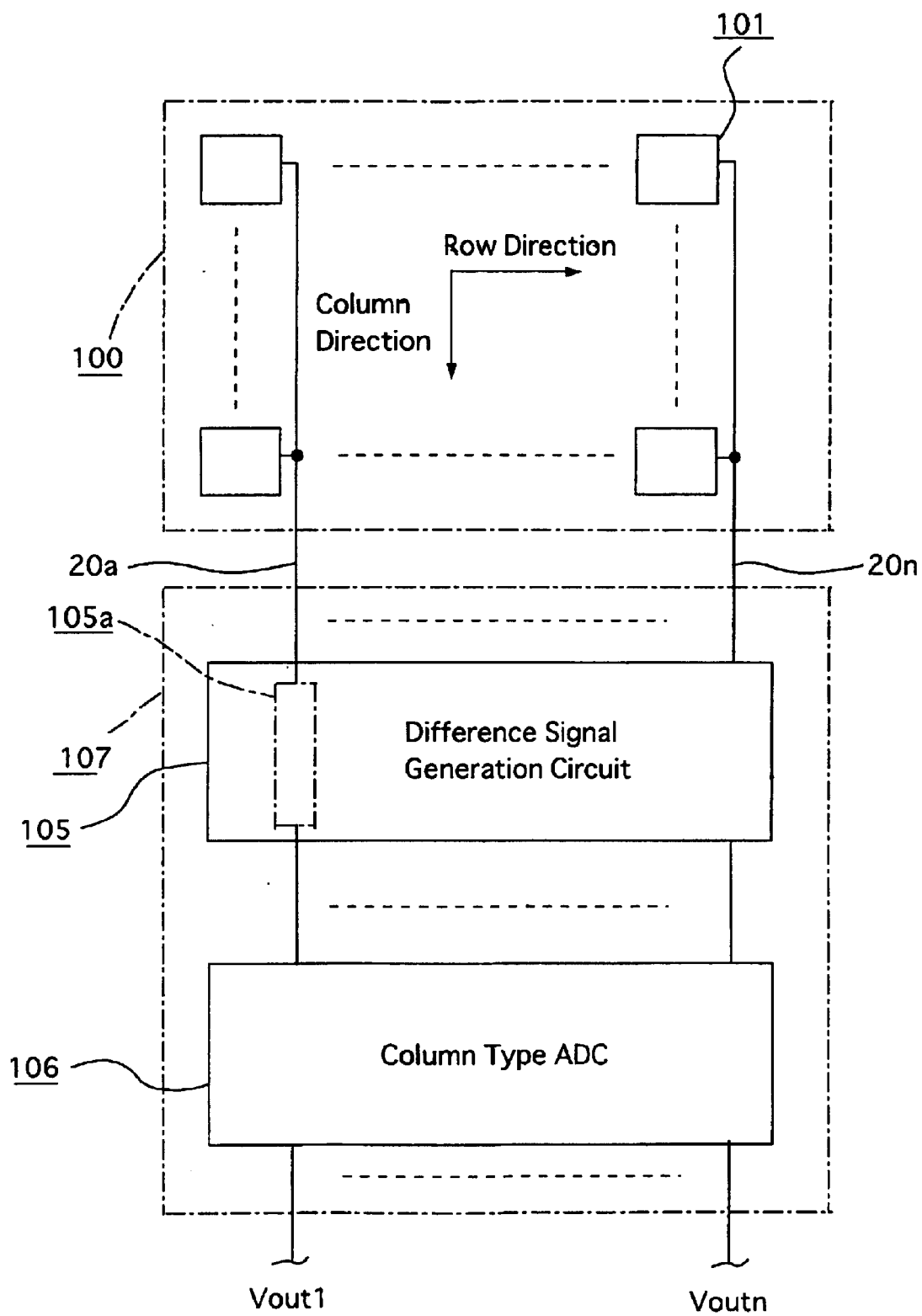
FIG. 3 is a view showing a circuit constitution of a solid-state imaging device including the variable gain amplifier according to the first embodiment of the present invention.

FIG. 3 is a view showing a circuit constitution of the solid-state imaging device according to the first embodiment of the present invention. As shown in FIG. 3, this solid-state imaging device is provided with an optical sensor array 100 and a signal output circuit 107. The signal output circuit 107 is provided with a difference signal generation circuit 105 each column disposing the variable gain amplifier 105a of FIG. 2 and a column type analog/digital converter (referred to as a column type ADC, hereinafter) 106. By driving MOS transistors of pixels (photoelectric conversion devices) 101 arrayed in rows, the signal output circuit 107 outputs, for respective rows, digitized video signals (Vout1, . . . Voutn) which is proportional to a quantity of incident light and containing no second signal voltage Vn components.

First, the optical sensor array 100 is described. This optical sensor array 100 employs a two-dimensional constitution where the pixels 101 are arrayed in a matrix form of rows and columns.

Figure 9:
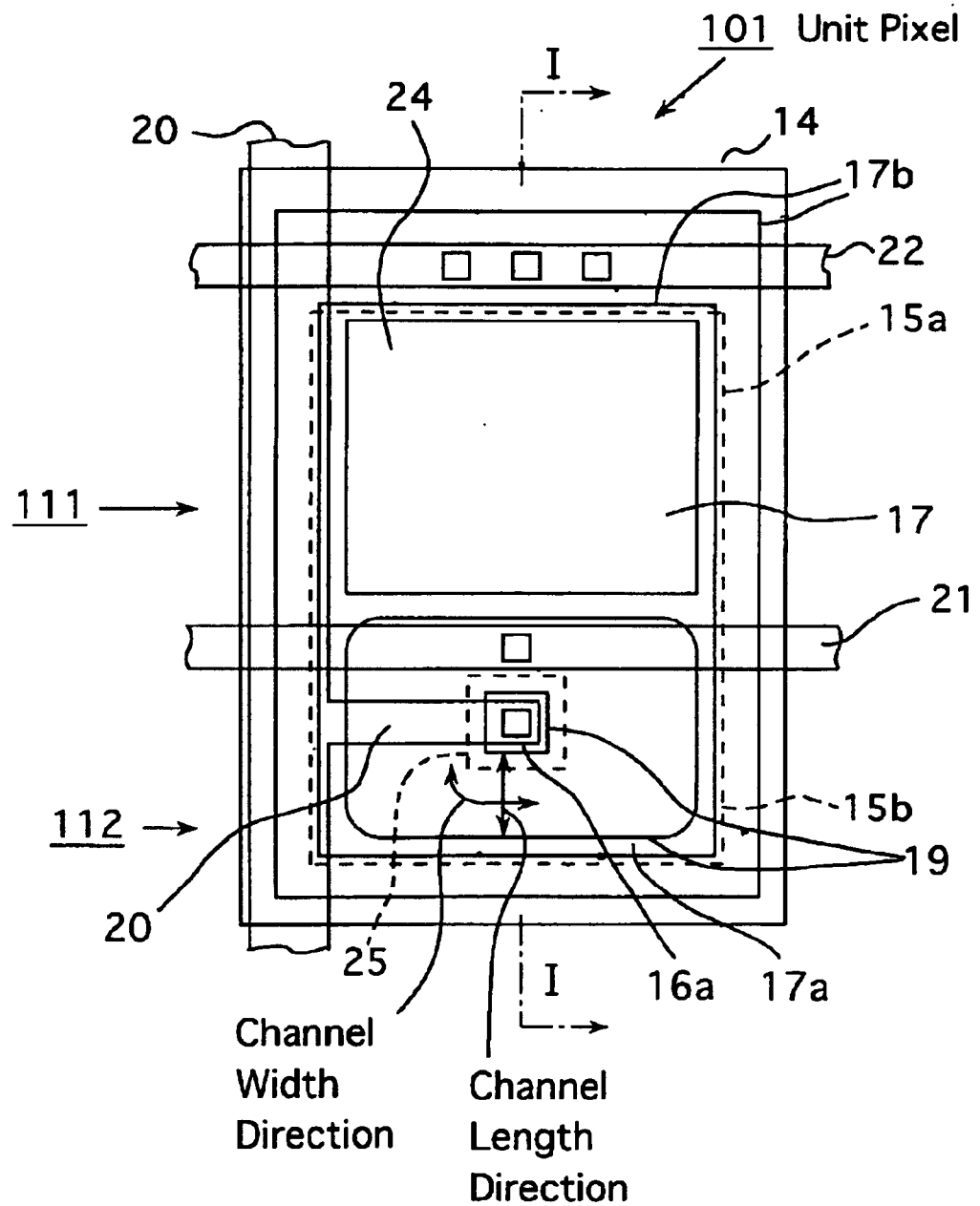
FIG. 9 is a plan view showing a device structure in a pixel of an optical sensor array constituting the solid-state imaging device according to each of the first and second embodiments.
Figure 10:
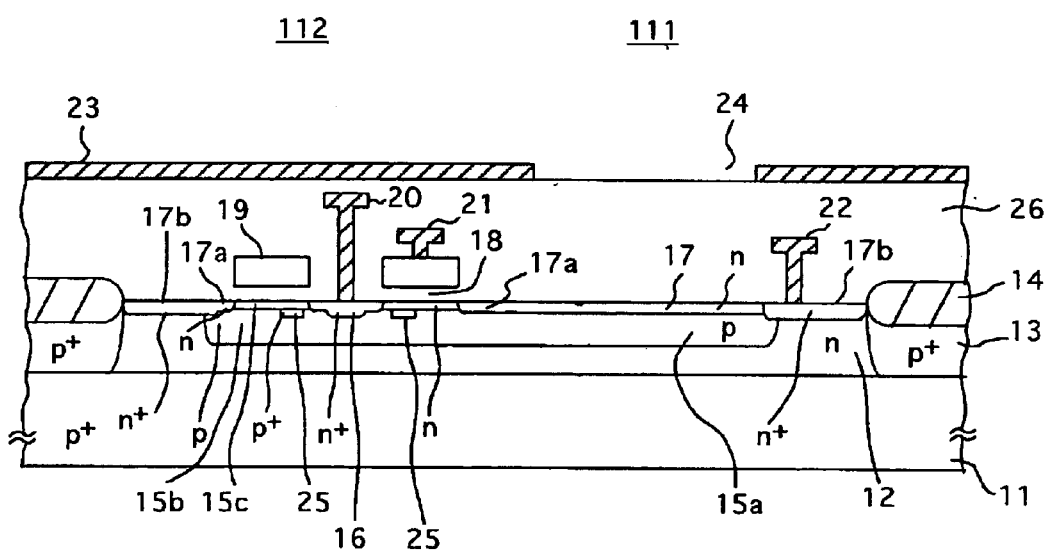
FIG. 10 is a sectional view taken along line I—I of FIG. 9.

Next, a device structure in each of the pixels 101 is described. FIG. 9 is a plan view showing a device layout in the pixel 101; and FIG. 10 is a sectional view showing a device sectional structure in the pixel, which corresponds to a sectional view taken along line I—I of FIG. 9.

The pixel 101 includes a photo diode 111 and a MOS transistor 112 for detecting an optical signal, which are provided adjacently to each other.

The photo diode 111 and the MOS transistor 112 are respectively formed in different well regions, i.e., a first well region 15a and a second well region 15b which are connected to each other. The first well region 15a having the photo diode 111 formed therein constitutes a part of a region where charges are generated by light irradiation. The second well region 15b having the MOS transistor 112 formed therein is defined as a gate region where a channel threshold voltage can be changed by a potential applied to the region 15b.

A drain region 17a of the MOS transistor 112 is formed so as to surround an outer peripheral part of a ring-shaped gate electrode 19, and a source region 16 is formed so as to be surrounded by an inner periphery of the ring-shaped gate electrode 19.

The drain region 17a is extended to form an impurity region 17 of the photo diode 111. That is, the impurity region 17 and the low-concentration drain region 17a are formed as one body such that most parts of the regions are placed on surface layers of the first and second well regions 15a and 15b connected with each other.

In addition, a carrier pocket (heavily doped buried layer) 25 which is a feature of the solid-state imaging device is formed in a peripheral part of the source region 16 so as to surround the same in the second well region 15b below the gate electrode 19.

The drain region 17a is connected through a contact region 17b to a drain voltage (VDD) supply line (or drain electrode) 22; the gate electrode 19 is connected to a vertical scanning signal (VSCAN) supply line 21; and the source region 16 is connected to a vertical output line (or source electrode) 20.

The foregoing constituent components of the pixel 101 are covered with a light transmissive insulating film, and a region other than that of a light-receiving window 24 of the photo diode 111 is shielded from a light by a metal layer (light shielding film) 23 formed on the insulating film.

Next, description is made for a peripheral circuit for driving the pixels 101 arrayed in the rows and columns by referring to FIGS. 2, 3, 9 and 10. Though not shown in the drawings, a driving scanning circuit of a vertical scanning signal (VSCAN) and a driving scanning circuit of a drain voltage (VDD) are disposed around the pixel 101 to supply signals for scanning the pixel 101.

From the driving scanning circuit of the vertical scanning signal (VASCAN), the vertical scanning signal supply line 21 comes out for each row. Each vertical scanning signal supply line 21 is connected to the gate electrode 19 of the MOS transistor 112 in each of all the pixels 101 arrayed in the row direction.

From the driving scanning circuit of the drain voltage (VDD), the drain voltage supply line (VDD supply line) 22 comes out for each row. Each drain voltage supply line (VDD supply line) 22 is connected to the drain region 17a of the MOS transistor 112 in each of all the pixels 101 arrayed in the row direction.

Vertical output lines 20a and 20b are provided for respective columns. These vertical output lines 20a and 20b are respectively connected to the source region 16 of the MOS transistor 112 in each of all the pixels 101 arrayed in the column direction. A booster circuit, not shown, is connected to each of the vertical output lines 20a and 20b to supply a large positive voltage for initialization of the pixel 101. In other words, a boosted voltage is applied to the source region 16 of the MOS transistor 112 of each pixel 101 for each column. The boosted voltage is passed on through a capacitor between the gate and source of the MOS transistor 112, and is lastly applied to the gate region 19. Thus, carrier sweeping can be promoted by increasing electric field strength applied to the well regions 15a and 15b.

The source region 16 of the MOS transistor 112 is connected through the vertical output lines 20a and 20b to an input end of the signal output circuit 107. In other words, the source region 16 is connected to the input end of the difference signal generation circuit 105 in the signal output circuit 107 for each column, and is directly connected to the input capacitor Ci shown in FIG. 2 when a signal is read out. Though omitted in FIG. 3, on midways of the vertical output lines 20a and 20b, switch devices are provided, in practice, to control signal flows.

A first signal voltage Vt and a second signal voltage Vn are inputted to the input end of the difference signal generation circuit 105. From the output terminal of the difference signal generation circuit 105, there is outputted a difference signal Vs (=Vt−Vn) which is obtained by subtracting the second signal voltage Vn generated upon initialization of the pixel 101 from the first signal voltage Vt. Moreover, the output of the difference signal generation circuit 105 is connected to the input end of the column type ADC 106 for each column.

In the difference signal generation circuit 105, by selecting a capacitance of the feedback capacitor Cf based on the signals Gsel1 and Gsel2 from the outside, gain adjustment can be performed in such a way as to set the level of the difference signal Vs within the range of the digital encoding analog input level. Thus, by performing gain adjustment when necessary, the difference signal Vs or Vsamp which has an output level adjusted is outputted from the output terminal.

Figure 4A:
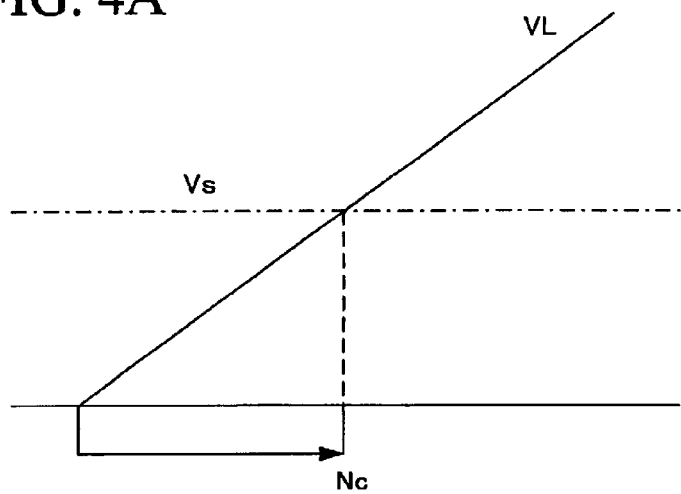
FIGS. 4A and 4B are views showing operations of a signal processing circuit (column type ADC) included in the circuit constitution of the solid-state imaging device of FIG. 3.
Figure 4B:
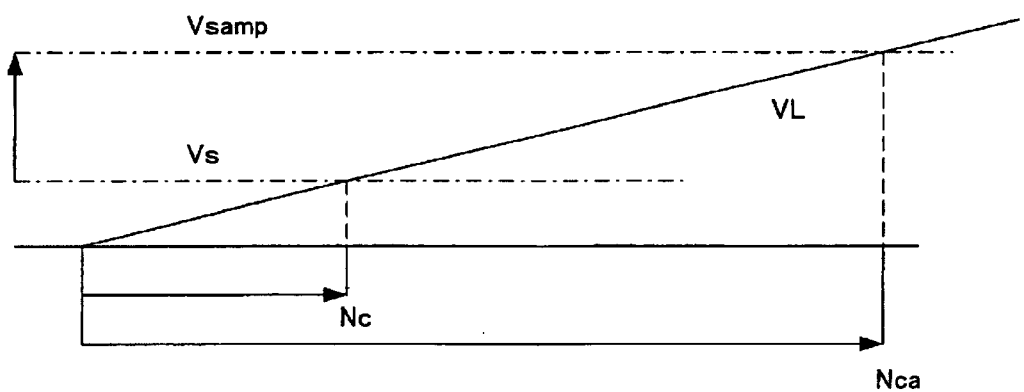

The column type ADC 106 compares the difference signal Vs or Vsamp as an analog signal with a comparison lamp voltage VL having a predetermined gradient by a not-shown comparator as shown in FIGS. 4A and 4B, and converts the difference signal Vs or Vsamp into a pulse count Nc or Nca corresponding to the amplitude of the difference signal Vs or Vsamp by use of a not-shown pulse counter. Note that the pulse count Nca is multiplied by a coefficient in consideration of an amplifying gain, and is thereby converted into the pulse count Nc corresponding to the actual difference signal Vs.

A digitized video signal is outputted from the output terminal of the column type ADC 106 while corresponding to a pixel array of each row.

As described above, according to the solid-state imaging device of the embodiment of the present invention, the difference signal corresponding to the optical signal can be amplified by a gain so as to set the difference signal in the range of the digital encoding analog input level.

In addition, the foregoing solid-state imaging device is characterized by its capability of reading out the optical signal even without connecting any active loads such as a constant current source to the source region 16 which is the output end of the pixel 101. This is attributed to the fact that the MOS transistor 112 for signal detection includes the heavily doped buried layer 25 for storing photo-generated charges (holes), which is provided below the channel so as to surround the source region 16. The reason for the above is as follows.

Photo-generated holes are stored in a potential well of the p-type heavily doped buried layer 25, and thus a threshold voltage is modulated by changing an amount of negative space charges in the depleted well region 15b. Thus, a surface potential of the MOS transistor 112 is decided. In this event, since a gate potential is maintained constant by an external power source, the surface potential is uniquely decided by the photo-generated holes stored in the potential well. As a state of the photo-generated holes stored in the heavily doped buried layer 25 is not influenced by a source potential, when a source follower having a signal charge storage capacitor as a load is formed to read out a signal, no unnecessary feedback operations are applied on the heavily doped buried layer 25 even if the source potential is changed during the signal reading. Accordingly, it is not necessary to maintain a potential difference between the source and the gate constant by connecting the constant current source to the source region 16 of the MOS transistor 112. Thus, the surface potential can be accurately transmitted to the source even if only capacitors capable of being readily matched for characteristics are set as the load of the source follower.

Therefore, it is possible to read out a signal while suppressing a fixed pattern noise.

(iv) Detecting and Reading Operations of Optical Signal

Figure 5:
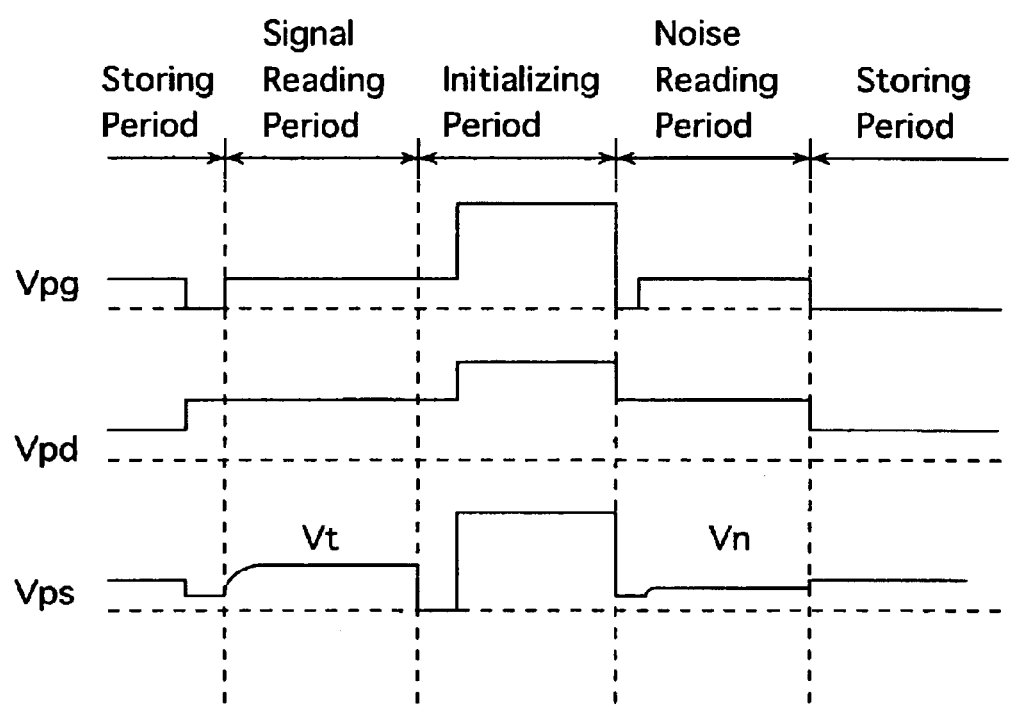
FIG. 5 is a timing chart when the solid-state imaging device according to the first embodiment of the present invention is operated.
Figure 6:
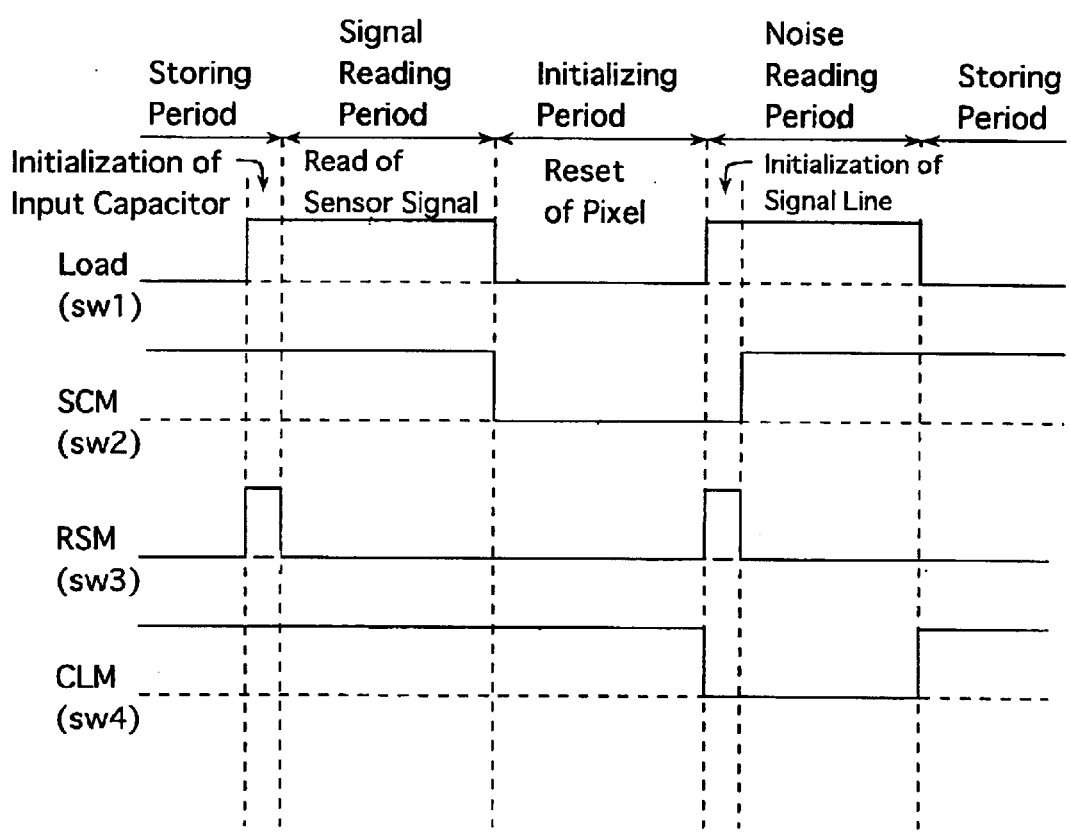
FIG. 6 is a timing chart showing a difference signal generating operation of the solid-state imaging device according to the first embodiment of the present invention.

Next, description is made for optical signal detecting and reading operations of the first embodiment of the present invention by referring to FIGS. 4 to 6.

Each of FIGS. 4A and 4B shows an operation of the column type ADC 106.

FIG. 5 is a timing chart illustrating optical signal detecting and reading operations by focusing on the pixel 101, where the foregoing MOS transistor for optical signal detection is an nMOS transistor.

FIG. 6 is a timing chart for an operation of the difference signal generation circuit 105, where Vout1, ... Voutn denote digitized video signals outputted from the signal output circuit 107.

In the optical signal detecting and reading operations, as shown in FIG. 5, a series of steps including a storing period, a signal reading period, a sweeping period (initializing period), and a noise reading period are repeated.

First, the series of steps are described by referring to FIG. 5. For convenience, the description is started from the storing period. When necessary, reference may also be made to FIGS. 2, 3, 9 and 10.

In the storing period, the photo diode 111 is irradiated with a light to generate photo-generated holes. These photo-generated holes are transferred below the channel region of the MOS transistor 112, and stored in the heavily doped buried layer 25. Accordingly, since a threshold voltage of the MOS transistor 112 is changed, in the next reading period, the change of the threshold voltage is outputted as a source voltage Vps.

In the signal reading period, the MOS transistor 112 is operated to output the source voltage Vps as an optical signal proportional to a storage quantity of photo-generated holes, and the source voltage Vps is stored in the input capacitor Ci. The source voltage Vps constitutes a signal voltage Vt obtained by converting the optical signal into the electric signal, and contains a second signal voltage component Vn in addition to a pure signal voltage component Vs according to light intensity.

In the initializing period, the switch device SW1 is disconnected, high voltages are applied through the source region 16 of the MOS transistor 112 to the gate electrode 19 and the drain region 17a, and the stored holes are discharged from the photo diode 111 and the MOS transistor 112 for optical signal detection, thereby initializing the pixel 101.

In the noise reading period, the source voltage Vps in the initialized state is outputted as the second signal voltage Vn from the pixel 101, and then inputted to the signal output circuit 107 to output a difference signal Vs (=Vt−Vn) obtained by removing the second signal voltage Vn.

After the end of the noise reading period, the process returns to the foregoing storing period again.

Next, by referring to FIG. 6, detailed description is made for an operation for generating a digitized difference signal Vs while corresponding to the series of steps including the storing period, the signal reading period, the sweeping period (initializing period), and the noise reading period by focusing on the variable gain amplifier 105a (in the difference signal generation circuit 105) of FIG. 2.

In the storing period, signals SCM and CLM are both set to high levels (referred to as H levels, hereinafter), and the switch devices SW2 and SW4 are connected. Signals Load and RSM are both set to low levels (referred to as L levels, hereinafter), and the switch devices SW1 and SW3 are disconnected.

In a period (input capacitor initializing period) at the end of the storing period, the signals Load, SCM, RSM, CLM, Gsel 1, and Gsel 2 are all set to H levels to turn ON (connect) the switch devices SW1 to SW6, and then charges of the capacitor C1 as the input capacitor Ci and of the capacitors C2 to C4 as the feedback capacitor Cf are initialized.

Then, in the sensor signal reading period (signal reading period), the signal RSM is set to the L level to turn OFF (disconnect) the switch device SW3. The other switch devices SW1, SW2 and SW4 are maintained in the previous states thereof. Accordingly, a first signal voltage Vt from each pixel 101 is supplied to the input capacitor Ci of the difference signal generation circuit 105. However, this signal voltage Vt contains an optical signal component Vs and a second signal voltage component Vn at the initialization of the pixel 101.

In this event, a potential difference between both ends of the input capacitor Ci of the difference signal generation circuit 105 is set to Vt-Vref. Then, since the switch device SW4 is ON, an output of the operational amplifier 31 of the difference signal generation circuit 105 becomes Vref.

In the pixel initializing period (initializing period), the signals Load and SCM are set to L levels to turn OFF the switch devices SW1 and SW2. The other switch devices SW3 and SW4 are maintained in the previous states thereof. Meanwhile, a high voltage is applied to the output end of the pixel 101 to initialize the pixel. That is, the stored charges are removed from the photo diode 111 and the MOS transistor 112.

Thereafter, in the noise reading period, in a period of rising (signal line initializing period), the vertical output lines 20a and 20b are set to ground potentials through a not-shown switch device, the signal SCM is set to the L level, and the switch device SW2 is maintained in disconnection. Furthermore, while setting the signal CLM to the L level to disconnect the switch device SW4, the signal Gsel1 is set to the H level to connect the switch device SW5 and thus select the capacitor C3, and the feedback capacitor Cf is set as equal to the input capacitor Ci. Here, a capacitance equal to the capacitance of the input capacitor Ci is set to C2+C3. Furthermore, the signals Load and RSM are set to the H level to connect the switch devices SW1 and SW3. Thus, charges stored in the signal line including the input capacitor Ci in the difference signal generation circuit 105 are initialized. In addition, since one end side of the input capacitor Ci becomes Vref, the charges Ci·(Vt−Vref) stored in the input capacitor Ci are transferred to the feedback capacitor Cf (=C2+C3). Thus, a potential difference between both ends of the input capacitor Ci becomes zero.

After the passage of the signal line initializing period, while setting the signal SCM to the H level to connect the switch SW2, the signals RSM and CLM are set to the L level to disconnect the switches SW3 and SW4. Moreover, the signal Gsel1 is set to the H level to connect the switch SW5 and thus select the capacitor C3. Thus, the potential difference between both ends of the input capacitor Ci of the difference signal generation circuit 105 is changed from zero to Vn−Vref. A charge Ci·(Vt−Vn)/Cf(=Vs) corresponding to the above is also stored in the feedback capacitor Cf, and an output of the operational amplifier 31 becomes a signal voltage (Vref−Vs) containing the difference signal Vs.

Then, the difference signal Vs is compared with the range of the digital encoding analog input level. If a level of the difference signal Vs is within the range of the digital encoding analog input level, the difference signal is directly outputted to the column type ADC 106.

On the other hand, when the level of the difference signal Vs is smaller than, for example a lower limit of the range of the digital encoding analog input level, a capacitance of the feedback capacitor Cf is selected based on a signal from outside such that the difference signal Vs is amplified by a gain so as to set the level of the difference signal Vs larger than the lower limit. Here, if a capacitance capable of obtaining a necessary amplifying gain is C2+C4(<C2+C3), the signal Gsel 1 is set to the L level to disconnect the switch SW5, the signal Gsel 2 is set to the H level to connect the switch SW6, and the capacitor C2+C4 is selected as the feedback capacitor Cf.

Then, after the initialization of the input capacitor Ci and the feedback capacitor Cf, a new first signal voltage Vt and a new second signal voltage Vn are sequentially inputted to the input capacitor Ci to be converted into charges, and the charges are then transferred to the feedback capacitor Cf. Sequentially, a new second signal voltage Vn is inputted to the input capacitor Ci to be converted into charges, and the charges are then transferred to the feedback capacitor Cf. In other words, the potential difference between both sides of the capacitor C1 of the input capacitor Ci is changed from Vt−Vref to Vn−Vref via zero. A charge Ci·(Vt−Vn)/Cf(=Vsamp) corresponding to the above is also stored in the capacitor (C2+C4) as the feedback capacitor Cf, and a signal voltage (Vref−Vsamp) containing a difference signal Vsamp amplified is outputted from the output of the operational amplifier 31.

Then, the difference signal Vs or Vsamp is inputted to the column type ADC 106 shown in FIG. 2 and is converted into a digital signal. Furthermore, this digital signal is outputted as a video signal from the output terminal of the column type ADC 106.

Besides, the amplifier which has an offset value is provided each column. Therefore, it is supposed that an output signal of the column type ADC 106 includes the offset component each column. This offset component can be readily removed by the following way. It is the way of converting the offset to a digital signal and memorizing it, followed by adding it as a signal for compensation at the detection of an optical black signal during a blanking period, and then digitally operating to remove the digital optical black signal from the digital difference signal.

The present invention has been described above in detail according to the first embodiment. However, a scope of the present invention is not limited to the example specifically described in the foregoing embodiment, and changes and modifications of the foregoing embodiment without departing from the teachings of the present invention are within the scope of the present invention.

For example, as a reference for comparing the difference signal, the range of the digital encoding analog input level is used. However, there is no limitation in this regard.

Second Embodiment (i) Constitution of Solid-state Imaging Device

Figure 7:
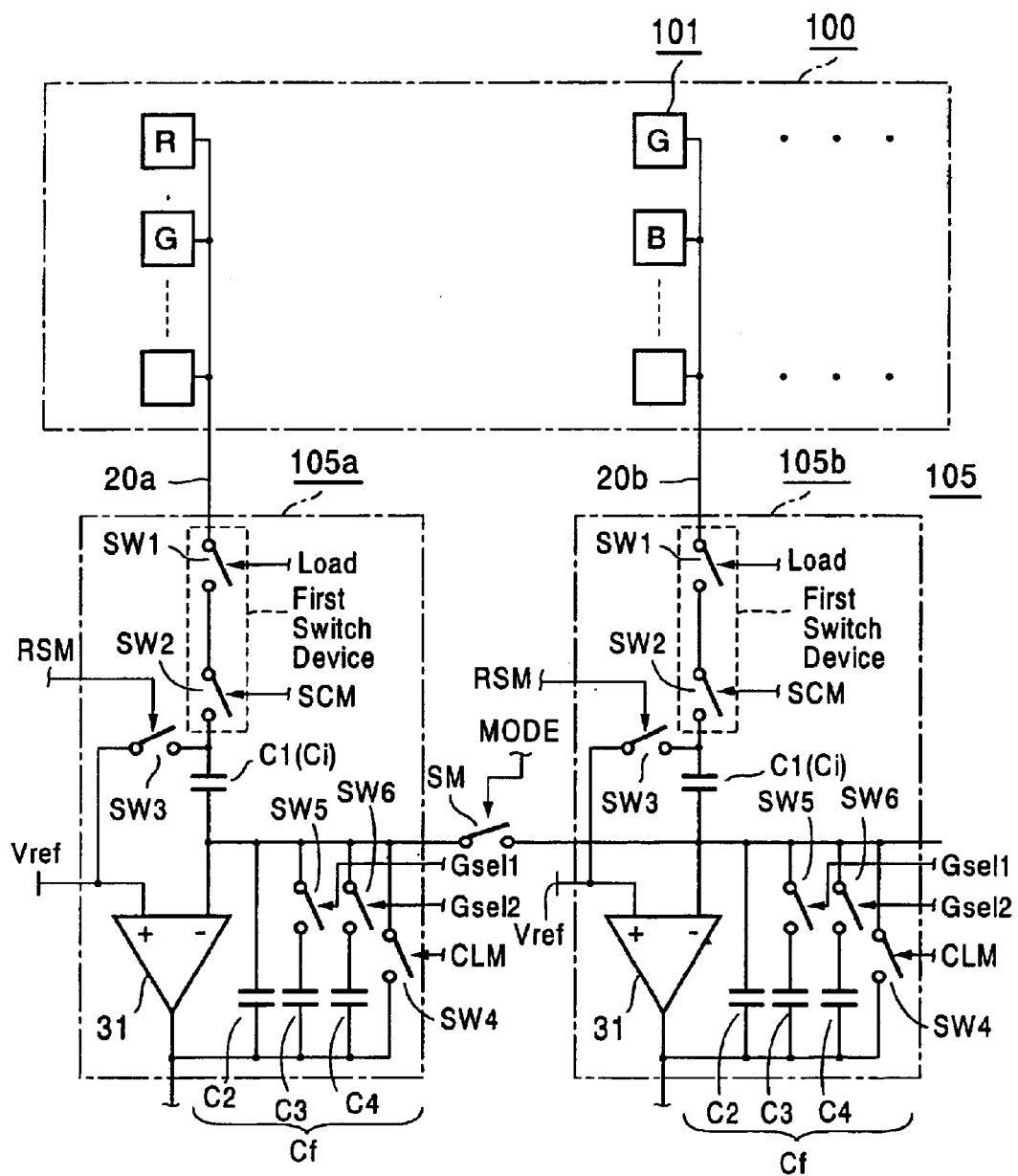
FIG. 7 is a view showing a circuit constitution of a solid-state imaging device comprising a signal output circuit according to a second embodiment of the present invention.

By referring to FIG. 7, description is made for a constitution of a solid-state imaging device according to a second embodiment of the present invention. FIG. 7 is a view showing a circuit constitution of the solid-state imaging device according to the second embodiment of the present invention.

In this solid-state imaging device, this embodiment is different from the first embodiment, as shown in FIG. 7, in that a switch device (a pixel mixing switch device) SM is provided between a negative input terminal (−) of an operational amplifier 31 of a variable gain amplifier 105a of one column and a negative input terminal (−) of an operational amplifier 31 of a variable gain amplifier 105b of adjacent column thereto among variable gain amplifiers 105a, 105b, . . . which each is provided each column in a difference signal generation circuit 105.

The arrangement of an optical sensor array 100 according to this embodiment is correspondent with a basic color filter array of Bayer system. In this color filter array, "R", "G", "B" pixels are arranged in four regions adjacent to each other, and "G" pixels of same color are arranged obliquely to each other. Vertical output lines 20a, 20b connected to the "G" pixels are connected to the input ends of the variable gain amplifiers 105a, 105b, respectively.

This circuit construction corresponds to the same one as the first embodiment by disconnecting the switch device SM, and thus the circuit can be derived similar to the first embodiment. On the other hand, the difference signals of the "G" pixels of at least two columns adjacent to each other are mixed by connecting the switch device SM applying a switching signal MODE, and thus averaged video signals can be outputted from the respective column output ends of the circuit.

Besides, the variable gain amplifiers 105a, 105b. . . are applied as an amplifier for a signal voltage outputted from a pixel. However, the amplifiers in which the capacitors C3, C4 and switch devices SW5, SW6 are omitted from the variable gain amplifiers 105a, 105b may be used if gain adjustments are not necessary.

(ii) Photodetecting Operation

Next, by referring to drawings, description is made for a photodetecting operation of the solid-state imaging device according to the second embodiment.

The solid-state imaging device according to this embodiment is capable of performing both the ordinary operation similar to the first embodiment and a pixel mixing in the thinning operation. For the ordinary operation, the switch device SM is disconnected to correspond to the same circuit construction as the first embodiment, and thus the circuit is operated similarly to the first embodiment. With this, a level-adjusted video signal can be outputted.

Figure 8:
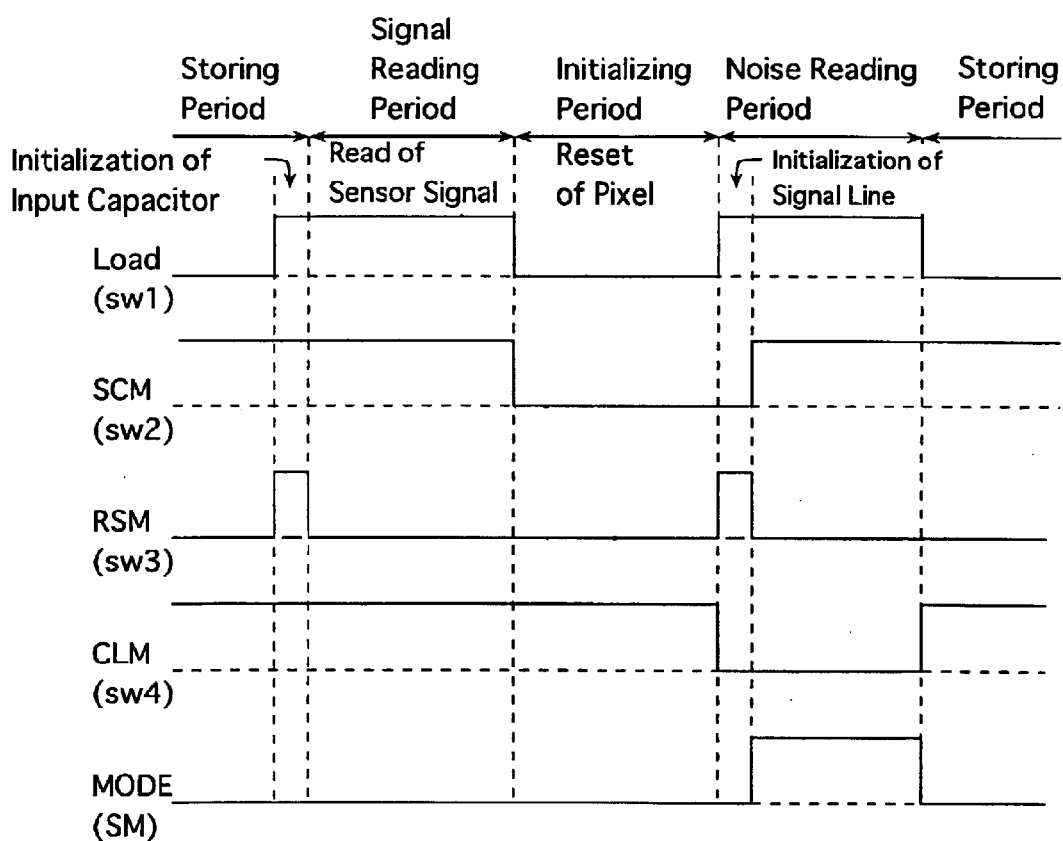
FIG. 8 is a timing chart of a pixel mixing operation of the solid-state imaging device according to the second embodiment of the present invention.

Next, a thinning operation is described as follows. FIG. 8 is a timing chart for a thinning operation performed by using the difference signal generation circuit 105 of FIG. 7. The description necessarily refers to FIG. 7. In this case, the feedback capacitor Cf is assumed to be composed of only C2 among the capacitors C2, C3, C4.

In the optical signal reading operation including the pixel mixing operation of this embodiment, a series of steps including a storing operation, a signal reading operation, a sweeping operation (initializing operation), and a noise reading operation are repeated. The pixel mixing operation is performed simultaneously during the noise reading operation.

First of all, from the storing operation to the initializing operation of a signal line, the pixel-mixing switch device SM is disconnected to perform the same operation as that being described in FIG. 6 of the first embodiment. Accordingly, charges Ci·(Vta−Vref) is accumulated in the feedback capacitor Cf of the variable gain amplifier 105a, and charges Ci·(Vtb−Vref) is accumulated in the feedback capacitor Cf of the variable gain amplifier 105b while the signal line including the input capacitor Ci is initialized.

Sequentially, the operation is shifted to the noise reading operation. During the noise reading operation, the signal MODE is set to H level to connect the switch device SM. Thus, the negative input terminals of the operational amplifiers 31 of the variable gain amplifiers 105a, 105b of the adjacent two columns are connected to each other. The connection results in the state of capable of performing a pixel mixing. Simultaneously, the signal SCM is set to H level to connect the switch device SW2, and the signal RSM is set to L level to disconnect the switch device SW3 while the switch device SW1 is maintained in connection and the switch device SW4 is maintained in disconnection. Those result in the state of capable of inputting the second signal voltage Vna, Vnb from the pixels 101.

In the variable gain amplifier 105a, an input of the second signal voltage Vna from the pixel 101 is expected to allow the potential difference between the both ends of capacitor C1 to change from 0 to Vna−Vref and to allow the potential difference between the both ends of capacitor C2 to change to C1·(Vtb−Vna)/C2. And in the variable gain amplifier 105b, an input of the second signal voltage Vnb from the pixel 101 is expected to allow the potential difference between the both ends of capacitor C1 to change from 0 to Vnb−Vref and to allow the potential difference between the both ends of capacitor C2 to change to C1·(Vtb−Vnb)/C2. In this case, since the input ends of the capacitors C2 of the variable gain amplifiers 105a, 105b are connected to each other, charges which should be separately accumulated in respective capacitors C2 are mixed and averaged. The potential difference $\Delta V0$ between the both ends of each capacitor C2 results in approximately C1/C2·((Vta−Vna)+(Vtb−Vnb))/2. Further, the output of the each operational amplifier 31 results in Vref−$\Delta$V0. Afterwards, the signals are suitably processed to output the video signal of "G" from the video signal output terminal.

Incidentally, in the conventional typical solid-state imaging device, because of thinning of sampling pixels, MTF is deteriorated, an image of much moire is formed, or folding noises are generated. In addition, since the image sensor needs to be operated at a high speed, power consumption is increased.

On the other hand, according to the embodiment, by connecting the switch device SM, signals outputted from pixels 101 of at least two columns are mixed and averaged, thereby generating video signal regarding the thinning. Thus, even if thinning is carried out, deterioration of MTF is prevented. Since averaged video signals in the position of the pixel 101 thinned during scanning is outputted, no reduction occurs in a sampling frequency. As a result of the above, it is possible to prevent generation of the folding noises.

Moreover, since the number of times of signal processing is reduced according to the thinning, it is possible to prevent the increase in the power consumption. Further, multi-function of the signal output circuit is attained with a simple means of the switch device SM.

The present invention has been described above in detail according to the second embodiment. However, a scope of the present invention is not limited to the example specifically described in the foregoing embodiment, and changes and modifications of the foregoing embodiment without departing from the teachings of the present invention are contained within the scope of the present invention.

For example, in the second embodiment, though there is applied the basic color filter array of the Bayer system as the color array, the color filter array of the other system may be applied.

Further, various modified examples may be used as the photoelectric conversion device applied to the solid-state imaging device according to this invention. This is the same in the first embodiment as well. In those embodiment, there is used the photoelectric conversion device having the same structure as that of a photoelectric conversion device described in Japanese Patent (Patent Registration No. 2935492). However, there may be used photoelectric conversion devices of other structures such that an accurate signal voltage can be obtained even if a capacitor is directly connected to an output thereof.

Furthermore, the first and second well regions 15a and 15b are formed in the n-type epitaxial layer 12 on the p-type substrate 11. However, instead of the n-type epitaxial layer 12, a p-type epitaxial layer may be used. In this case, n-type impurities may be introduced into the p-type epitaxial layer to form an n-type well layer, and then first and second well regions 15a and 15b may be formed in the n-type well layer.

As described above, according to the present invention, even when amplitude of the analog difference signal is smaller than the suitable range of the digital encoding analog input level, the analog difference signal can be amplified to be suitably set within the requested range of the digital encoding analog input level.

As a result, when the analog difference signal is digitized, it is possible to secure the dynamic range and to improve the S/N ratio.

Moreover, the foregoing solid-state imaging device is characterized by including the heavily doped buried layer for storing photo-generated charges, which is provided below the channel of the MOS transistor for signal detection so as to surround the source region. And the foregoing solid-state imaging device is characterized by reading out the optical signal with directly connecting the source of the output of the pixel to only capacitor capable of being readily matched to each other for characteristics, without connecting it to a constant current source in which it is difficult to be matched to each other for characteristics. Therefore, the surface potential can be accurately transmitted to the source, and thus it is possible to read out a signal while suppressing a fixed pattern noise.

Furthermore, according to the other present invention, the pixels are arrayed in rows and columns, the amplifier is provided for each column to process an output signal from each pixel, and the pixel-mixing switch device is provided between the input terminals of the operational amplifiers in the amplifiers of at least two columns. During thinning, the switch device is connected, so that signals from pixels of at least two columns are mixed to be averaged and is outputted as a video signal of each pixel. Thus, it is possible to obtain an image with no folding noise, i.e., an image with no moire, and to reduce the power consumption.

What is claimed is:

1. An optical signal reading method for converting an optical signal into an electric signal, converting the electric signal into a digital signal, and then outputting the digital signal, wherein a plurality of the photoelectric conversion devices are arrayed in rows and columns, each of the photoelectric conversion devices including
(i) a photodetector, and
(ii) an insulated gate field effect transistor for optical signal detection provided adjacent to the photo detector, the insulated gate field effect transistor for optical signal detection including a heavily doped buried layer for storing photo-generated charges generated by the photo detector, the heavily doped buried layer being provided around a source region under a channel region below a gate electrode; and a variable gain amplifier is provided in each of the columns, the variable gain amplifier including
(iii) an input terminal for sequentially inputting a first signal voltage and a second signal voltage,
(iv) an output terminal for outputting a difference signal between the first signal voltage and the second signal voltage, (v) an operational amplifier having a positive input for inputting a reference voltage, a negative input, and an output connected to the output terminal, (vi) an input capacitor provided in a signal path extending from the input terminal to the negative input of the operational amplifier, the input capacitor having one end connected through the signal path to the input terminal and having the other end connected through the signal path to the negative input of the operational amplifier, (vii) a feedback capacitor provided between the negative input and the output of the operational amplifier, (viii) a first switch device for connecting/disconnecting a signal path extending from the input terminal to the one end of the input capacitor, (ix) a second switch device for connecting/disconnecting the reference voltage to the one end of the input capacitor, and (x) a third switch device for connecting/disconnecting the negative input and the output of the operational amplifier;

the optical signal reading method comprises the steps of:

(a) irradiating each photodetector with an optical signal;

(b) transferring photo-generated charges generated by the photodetector and storing them in the heavily doped buried layer of the insulated gate field effect transistor for optical signal detection, while connecting the second and third switch devices to initialize the input capacitor and the feedback capacitor;

(c) then, connecting the first and third switch devices, disconnecting the second switch device, outputting a signal voltage according to the photo-generated charges stored in the heavily doped buried layer from the insulated gate field effect transistor for optical signal detection, and then converting the signal voltage into charges and storing them in the input capacitor as the first signal voltage;

(d) then, connecting the second switch device and disconnecting the third switch device, so as to transfer the charges of the first signal voltage stored in the input capacitor to the feedback capacitor;

(e) then, discharging the photo-generated charges remaining in the heavily doped buried layer to initialize the photoelectric conversion device, thereafter connecting the first switch device, disconnecting the second and third switch devices, outputting a second signal voltage in the initialized state of the photoelectric conversion device from the insulated gate field effect transistor for optical signal detection, then converting the second signal voltage into charges, and storing a difference between the charges of the first signal voltage and the charges of the second signal voltage to generate the difference signal;

(f) converting the difference signal into a digital signal; and (g) then, adjusting a gain by adjusting a ratio of the input capacitor and the feedback capacitor so as to set the difference signal within a range of an analog input voltage which is converted into the digital signal, and outputting the difference signal having the output level adjusted from the operational amplifier to each of the columns.

2. An optical signal reading method of a solid-state imaging device which includes a plurality of photoelectric conversion devices arrayed in rows and columns for converting an optical signal into an electric signal and for outputting the electric signal, a plurality of amplifiers provided for the respective columns, each of the amplifiers for sequentially inputting a first signal voltage obtained by converting the optical signal into the electric signal, and a second signal voltage obtained by initializing the photoelectric conversion device, for converting the first signal voltage and the second signal voltage into charges, and for outputting a difference signal therebetween, and a video signal output terminal for outputting the difference signal outputted from the amplifier as a video signal corresponding to the optical signal, wherein each of the photoelectric conversion devices includes (i) a photodetector, and (ii) an insulated gate field effect transistor for optical signal detection, provided adjacently to the photodetector, the insulated gate field effect transistor for optical signal detection including a heavily doped buried layer for storing photo-generated charges generated by the photo detector, the heavily doped buried layer being provided around a source region under a channel region below a gate electrode, the first signal voltage and the second signal voltage are outputted from the source region of the insulated gate field effect transistor for optical signal detection; each amplifier including (iii) an input terminal for sequentially inputting the first signal voltage and the second signal voltage, (iv) an output terminal for outputting a difference signal between the first signal voltage and the second signal voltage, (v) an operational amplifier having a positive input for inputting a reference voltage, a negative input and an output connected to an output terminal of the amplifier, (vi) an input capacitor provided in a signal path extending from the input terminal of the amplifier to the negative input of the operational amplifier, the input capacitor having one end connected through the signal path to the input terminal of the amplifier and having the other end connected through the signal path to the negative input of the operational amplifier, (vii) a feedback capacitor provided between the negative input and the output of the operational amplifier, (viii) a first switch device for connecting/disconnecting the signal path, (ix) a second switch device for connecting/disconnecting the reference voltage to the one end of the input capacitor, and (x) a third switch device for connecting/disconnecting the negative input and the output of the operational amplifier, and a pixel mixing switch device connecting the negative inputs of the operational amplifiers of at least two columns, the method comprises the steps of (a) irradiating each photodetector with an optical signal;

(b) transferring photo-generated charges generated by the photo detector to the heavily doped buried layer of the insulated gate field effect transistor for optical signal detection and storing the charges therein, while connecting the second and third switch devices to initialize the input capacitor and the feedback capacitor;

(c) then, connecting the first and third switch devices, disconnecting the second switch device and the pixel mixing switch device, and thus outputting the first signal voltage corresponding to the photo-generated charges stored in the heavily doped buried layer from the insulated gate field effect transistor for optical signal detection, and converting the first signal voltage into charges and storing the charges in the input capacitor;

(d) then, connecting the second switch device, disconnecting the third switch device, and thus transferring the charges of the first signal voltage stored in the input capacitor to the feedback capacitor; and (e) then, discharging the photogenerated charge remaining in the heavily doped buried layer to initialize the photoelectric conversion device, thereafter connecting the first switch device and the pixel mixing switch device, disconnecting the second and third switch devices, outputting a second signal voltage in the initialized state of the photoelectric conversion device from the insulated gate field effect transistor for optical signal detection, thus converting the second signal voltage into charges and storing them in the input capacitor, then mixing the charges of the first signal voltages from the photoelectric conversion devices of at least two columns and the charges of the second signal voltage therefrom through the pixel mixing switch device connecting the negative input terminals of the operational amplifiers of the at least two columns, and then outputting an output signal from the operational amplifier.

* * * * *